Jan. 25, 1966 R. SCHMIDT 3,231,421

SEMICONDUCTOR CONTACT

Filed June 29, 1962

INVENTOR
R. SCHMIDT
BY
Arthur J. Torsiglieri
ATTORNEY

United States Patent Office 3,231,421
Patented Jan. 25, 1966

3,231,421
SEMICONDUCTOR CONTACT

Rudolf Schmidt, Warren Township, Somerset County, N.J., assignor to Bell Telephone Laboratories, Incorporated, New York, N.Y., a corporation of New York Filed June 29, 1962, Ser. No. 206,242
3 Claims. (Cl. 117—2.2)

This invention relates to semiconductor devices and more particularly to the provision of electrical contacts to the semiconductor elements in such devices.

The invention has particular application in the fabrication of a device which uses a silicon dioxide layer over a portion of the semiconductor element for controlling the geometry of junctions in the element and electrode connections on the surface of the element. An important class of devices of this kind is now described as the "planar" type.

In such devices a silicon dioxide layer is formed over a surface of the semiconductor element, a pattern is cut in the mask to expose underlying semiconductor material, and a diffusant is introduced selectively in such exposed region to effect a conversion in conductivity type. Additionally, typically a contact metal is subsequently evaporated over the silicon dioxide mask for alloying selectively into the region of converted conductivity type and forming a low resistance connection thereto.

Aluminum has been found the most desirable contact metal for forming such a low resistance contact when the element is of silicon, aluminum being substantially ohmic with respect to the P-type regions and, in addition, being of insufficient concentration, or solubility, even at the maximum level, to invert the surface of a degenerate N-type region.

One of the problems which has developed in the use of aluminum is that evaporation masking techniques are not sufficiently refined to limit the evaporation of the aluminum to the exposed silicon and at least a portion of the oxide itself is coated therewith. The aluminum advantageously should be removed from the oxide surface prior to the alloying step, otherwise the aluminum tends to alloy through the oxide and into the silicon as well as to the exposed silicon directly. This makes it difficult to fix accurately and reproducibly the location and extent of the contact which detracts from the reliability and reproducibility of the device. However, the removal of the aluminum from the oxide is time-consuming and expensive.

A specific object of this invention is to avoid this problem in the fabrication of silicon planar devices.

This invention is based, in one aspect, on the recognition that there are metals, such as palladium, which adhere to silicon tenaciously but are substantially nonadherent to silicon dioxide and that such metals can form with aluminum a stable intermetallic material suitable for making a good electrical contact to silicon.

In one specific embodiment of this invention, a layer of palladium is deposited over the surface on which is attached the silicon dioxide mask previously used for monitoring the impurity diffusion into the underlying silicon wafer and this palladium layer is coated with an overlayer of aluminum. Then, the structure is heated such that a stable aluminum-palladium mixture forms which adheres to the underlying silicon where the silicon was exposed to it by virtue of the pattern in the oxide mask but which does not penetrate the oxide proper but rather there either peels off or can be brushed off easily. As a consequence, electrical contact to the silcon is localized to the region initially exposed through the mask.

Thus a feature of this invention, in one aspect, is the fabrication of a contact structure by first providing under the contact metal an intermediate layer of a second metal which has the propertly of adhering to the semiconductor material but not to the material of which the mask is made.

The invention and its further objects and features will be understood more clearly and fully from the following detailed description rendered in conjunction with the accompanying drawing, wherein.

It is to be understood that the figures are not necessarily to scale, certain dimensions being exaggerated for purposes of illustration.

Figure 1:
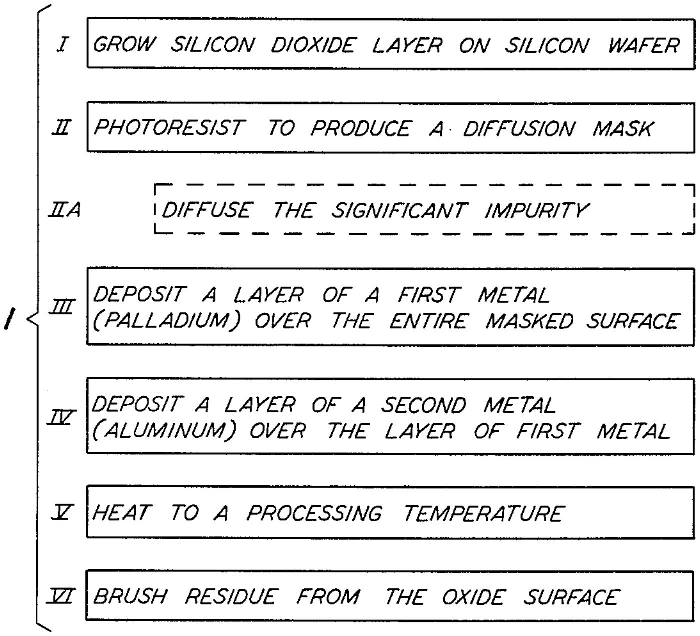
FIG. 1 is a block diagram illustrating the sequence of the steps of the method in accordance with this invention.

With specific reference to the figures, block I of FIG. 1 calls for the coating of a semiconductor wafer with an electrically insulating layer which ultimately acts to insulate a plurality of contacts from one another. For a silicon wafer, silicon dioxide is the preferred insulating layer. Block II calls for the step of forming a pattern including at least one opening in the insulating layer. This is done typically by photo-resist techniques. As recited in block IIA, significant impurities are diffused through this opening for forming therebeneath an impurity diffused region to which electrical connection is made in accordance with this invention. A layer, preferably of palladium, is deposited over the surface including both the insulating layer and exposed semiconductor as called for in block III. A compatible layer, preferably of aluminum, is deposited over the palladium as called for in block IV. This lamellate structure is then heated to form a stable alloy or compound, of aluminum-palladium in the preferred embodiment, which adheres only to the exposed semiconductor. The heating step is recited in block V. The residual metal overlying the oxide is removed easily by brushing as recited in block VI.

Figure 2:
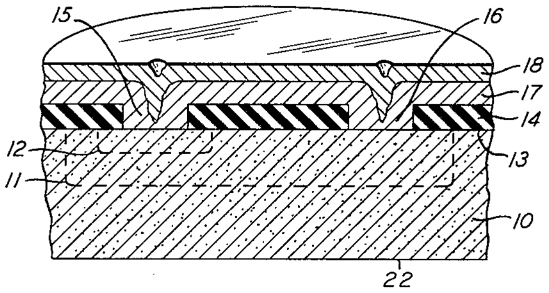
FIG. 2 is a cross-sectional schematic showing the structure of a semiconductor element being processed in accordance with this invention at the point following the deposition of the contact metals and prior to heat treatment.
Figure 3:
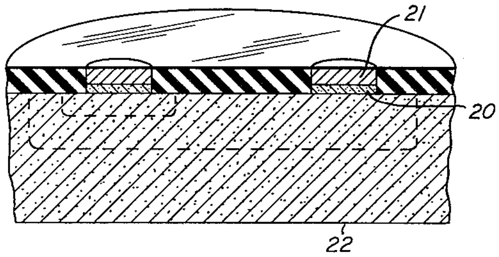
FIG. 3 is a cross-sectional schematic of a completed contact structure in accordance with this invention.

In FIG. 2 there is depicted a portion 10 of a silicon semiconductor wafer having superposed thereon a contact in accordance with the process of FIG. 1. Although the contact is shown as having distinct layers, after heating there is a certain amount of intermingling of the materials of the layers and the contact of FIG. 3 more clearly represents the final structure. The bulk of portion 10 is of N-type conductivity but there is a surface region 11 of P-type conductivity within which is a smaller surface region 12 of N-conductivity type. Surface 13 had been coated initially completely with a layer of silicon dioxide but this layer had been removed in localized portions for forming opening 15 over a portion of region 12 and opening 16 over a portion of region 11. Palladium layer 17 is deposited, typically by evaporation, onto the oxide to a thickness of about 2,000 angstrom units and abuts regions 11 and 12 where exposed. Aluminum layer 18 is deposited, typically by evaporation, on the palladium layer 17 to a thickness of about 4,000 angstrom units.

The above structure is heated to a temperature above the aluminum-silicon eutectic temperature of 577 degrees centigrade, at which temperature a certain amount of the palladium and silicon interdiffuse to form regions 20 of silicides at the openings in the oxide. Simultaneously, the aluminum and palladium intermingle to form regions 21 overlying regions 20, where a good electrical contact by way of regions 20 is made with the underlying silicon. Lead wires may then be attached to these regions by conventional means. The layers of metals overlying the oxide also intermingle during the heat treatment. However, because they peel off or are otherwise easily removed, the presence of this portion of the intermetallic compound is not illustrated in the figure.

In one specific embodiment, wafer 10 was an N-type silicon wafer having a diameter of one inch and a thickness of .012 inch. The wafer included a uniform concentration of $10^{17}$ atoms per cubic centimeter of phosphorus and had a resistivity of about 0.1 ohm-centimeter. A silicon dioxide mask was grown to a thickness of 5,000 angstrom units by well known steam oxidation techniques and etched to expose the appropriate surface area by well known photo-resist techniques. Region 11 was formed to a depth of 15,000 angstrom units by a predeposition and diffusion of boron at an elevated temperature from a vapor of boron oxide ($B_2O_3$) by well known techniques. The oxide was regrown and re-etched to expose a smaller surface area which was exposed subsequently to a vapor of phosphorus pentoxide ($P_2O_5$) at an elevated temperature to form region 12 to a depth of 5,000 angstron units. An opening was etched through the silicon dioxide mask to expose a portion of the surface of region 12. A 4,000 angstrom unit layer of palladium was evaporated over the silicon dioxide mask making contact with regions 11 and 12 where exposed. A 2,000 angstrom unit layer of aluminum was deposited over the palladium and the resulting structure heated to about 750 degrees centigrade for about five minutes. An electrical contact to surface 22, was made by conventional gold plating techniques.

Typically, the individual wafers are the result of the division of a larger slice of silicon more convenient for manufacturing a large number of devices. The description here is in terms of a single wafer for convenience.

The relative thicknesses of the palladium and aluminum layers are not of great significance in accordance with this invention as long as there is a quantity of aluminum sufficient to diffuse through the palladium to the silicon before the aluminum is bound up entirely in the intermetallic compound. This requirement insures that the region of contact to underlying silicon includes a concentration of aluminum. However, this requirement does not necessitate that the entire paladium layer be bound up in the intermetallic compound. This may or may not be the case. If the entire palladium layer is so bound up and the final device includes an intermetallic compound contiguous to the silicon surface, this compound is required by this invention to be adherent to the silicon but not the silicon dioxide. If some palladium or palladium silicides remain or form before all the palladium is bound up in the intermetallic compound, then the invention requires that the palladium rather than the intermetallic compound be adherent to the silicon and not the silicon dioxide. In the preferred embodiment, both palladium and the aluminum-palladium intermetallic compounds adhere to silicon. However, this explanation illustrates in terms of the elements of the preferred embodiment some of the possible ramifications of the invention.

Significant impurities other than aluminum, for example, gallium, indium, arsenic and strontium can be used in accordance with this invention. All that is required is that the impurity form a stable intermetallic compound with the intermediate layer. Similarly, palladium is not the only metal for use as an intermediate layer. Other metals such as nickel, gold, iron, cerium, chromium, lanthanum and uranium can be used. It is important that the metal be capable of forming a stable intermetallic compound or alloy with the overlayer, and that such resultant adhere to the semiconductor proper but not to the insulating material serving as the mask.

The above described illustrative embodiments are susceptible of numerous and varied modifications all clearly within the spirit and scope of the principles of the present invention, as will be apparent to those skilled in the art. For example, only N-P-N silicon transistors have been described specifically. It should be evident that P-N-P transistors are contemplated similarly. Moreover, a device in accordance with the invention may include further conductivity type regions which may or may not be contacted in the manner described. Similarly, it is not necessary that a plurality of conductivity regions be contacted simultaneously or successively in accordance with this invention, the invention being well adapted to the fabrication of a single contact. In addition, silicon dioxide has been described as a particularly desirable insulating layer in connection with silicon. Other insulating layers are known and useful in accordance with this invention, particularly in connection with other semiconductor materials. Examples of such insulating materials are natural oxides of germanium and some of the Group III–V compound semiconductor materials. No attempt has been made here to illustrate exhaustively all such possibilities.

What is claimed is:

1. In the fabrication of a semiconductor device from a wafer of semiconductor material, the method of making a metal contact to a limited portion of the surface of said wafer, said method comprising the steps of forming an oxide coating on said surface of said wafer, removing portions of said coating to expose the underlying semiconductor surface, depositing on said coating and said exposed semiconductor surfaces a layer of palladium, depositing on top of said palladium layer a layer of aluminum, heating said wafer to a temperature of at least the eutectic temperature of aluminum and said semiconductor for a period of about five minutes thereby rendering the metal layers overlying the oxide coating nonadherent, said portions overlying said semiconductor being firmly bonded thereto.

2. The method in accordance with claim 1 in which the oxide layer is one selected from the group consisting of the oxides of germanium and silicon.

3. The method in accordance with claim 2 in which the semiconductor material is selected from the group consisting of germanium and silicon.

References Cited by the Examiner

UNITED STATES PATENTS

| | | | |
|---|---|---|---|
| 2,802,760 | 8/1957 | Derick et al. | 148—1.5 |
| 2,829,422 | 4/1958 | Fuller | 148—1.5 |
| 2,858,489 | 10/1958 | Henkels | 148—1.5 |
| 2,861,230 | 11/1958 | Loup | 148—1.5 |
| 2,877,147 | 3/1959 | Thurmond | 148—1.5 |
| 2,981,877 | 4/1961 | Noyce | 148—1.5 |

RICHARD D. NEVIUS, *Primary Examiner.*

D. L. RECK, *Examiner.*